United States Patent [19]

Dozier

[11] 4,256,053

[45] Mar. 17, 1981

[54] CHEMICAL VAPOR REACTION SYSTEM

[76] Inventor: Alfred R. Dozier, 9332 Portsmouth Dr., Huntington Beach, Calif. 92646

[21] Appl. No.: 67,405

[22] Filed: Aug. 17, 1979

[51] Int. Cl.³ .................... C23C 11/00; H01L 21/68
[52] U.S. Cl. ................................................. 118/728
[58] Field of Search .............. 118/715, 719, 720, 721, 118/728–732, 722–725, 733, 900; 427/83–87, 91, 166, 167; 156/613; 148/1.5, 75, 175, 189; 432/6, 14, 17, 253, 258, 259; 211/41, 49 R

[56] References Cited

U.S. PATENT DOCUMENTS

| | | | |
|---|---|---|---|
| 1,965,059 | 7/1934 | Seibt | 118/730 |
| 3,578,495 | 5/1971 | Pammer et al. | 156/613 X |
| 3,637,434 | 1/1972 | Nakanuma et al. | 118/730 X |
| 3,672,948 | 6/1972 | Foehring et al. | 118/719 X |
| 3,989,004 | 11/1976 | Scholes | 118/732 |
| 3,998,333 | 12/1976 | Kamada | 432/258 X |
| 4,016,006 | 5/1977 | Joshinaka et al. | 148/189 X |
| 4,048,953 | 9/1977 | Froberg | 118/733 X |
| 4,053,294 | 10/1977 | Sullivan | 432/258 X |
| 4,069,009 | 1/1978 | Jamawaki et al. | 432/258 X |
| 4,098,923 | 7/1978 | Alberti et al. | 118/900 X |
| 4,108,106 | 8/1978 | Dozier | 118/715 |

FOREIGN PATENT DOCUMENTS

| | | | |
|---|---|---|---|
| 2248764 | 5/1965 | France | 118/500 |
| 131887 | 7/1978 | German Democratic Rep. | 118/715 |

OTHER PUBLICATIONS

*IBM Technical Disclosure Bulletin*, vol. 13, No. 6, Nov. 1970, p. 1459, Eshback et al., "Emitter Diffusion System".
*IBM Technical Disclosure Bulletin*, vol. 19, No. 10, Mar. 1977, pp. 3734–3735, Clark et al., "Water Holder".

*Primary Examiner*—Morris Kaplan
*Attorney, Agent, or Firm*—Donald D. Mon

[57] ABSTRACT

A chemical vapor reaction system including a closed reaction vessel. The vessel forms a reaction chamber which has an axis of length and a cross-section normal to the axis. An end closure is removable to provide access to the reaction chamber. Reactant material is supplied to the reaction vessel through at least one reactant supply conduit, which discharges reactant to the reaction chamber, and an exhaust conduit removes degradation products and excess reactant from the vessel. A boat is placed in a reaction region in the vessel and supports substrates to be treated. The substrates are stacked parallel to and spaced from one another along the axis. The boat includes a distributor which is placed upstream from the substrates, between the supply conduit and the substrates so as to distribute the reactant as it enters the reaction region. The exhaust conduit draws from an exhaust region downstream from the boat, which exhaust region extends at least for the axial length of the stack of substrates.

13 Claims, 8 Drawing Figures

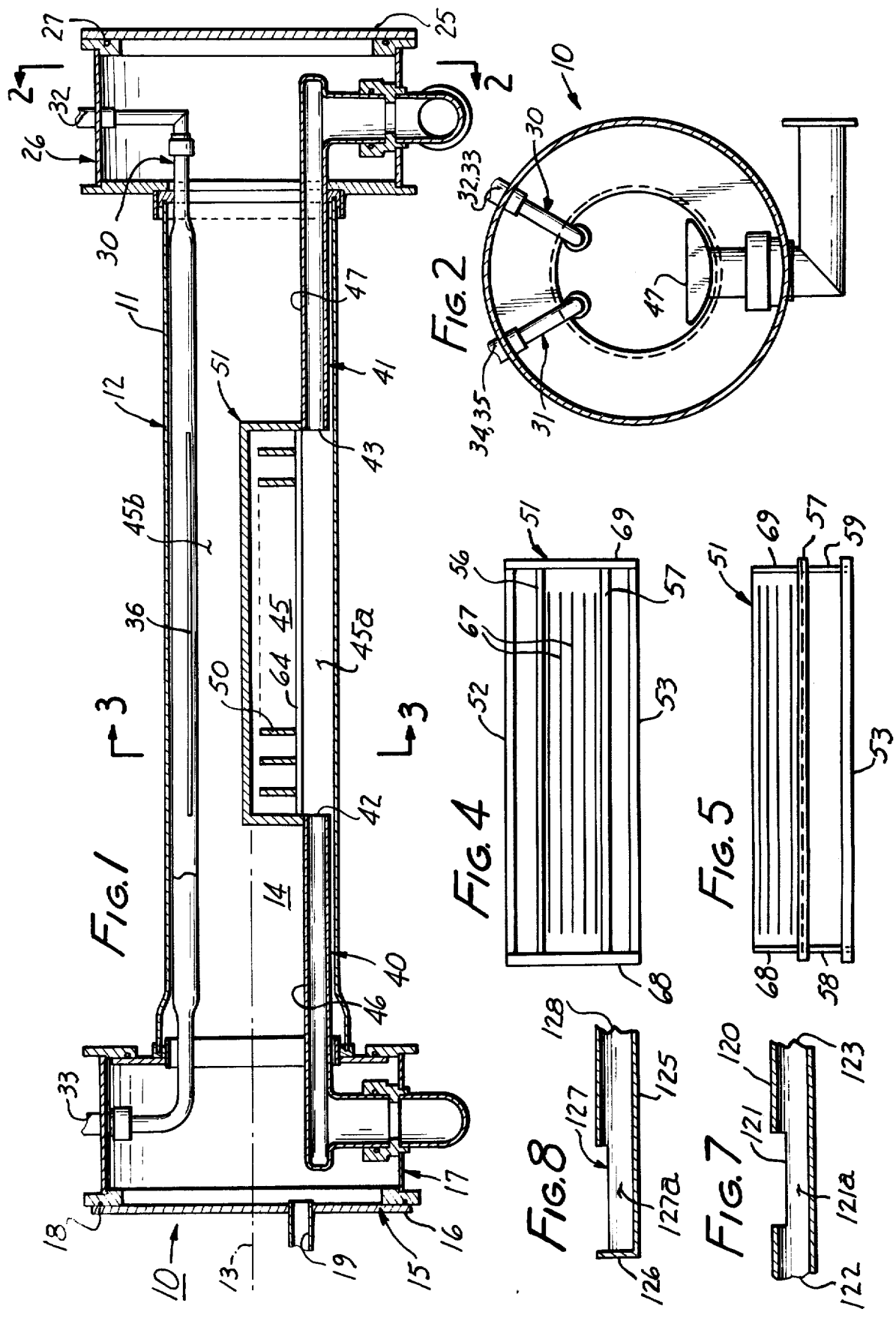

4,256,053

CHEMICAL VAPOR REACTION SYSTEM

FIELD OF THE INVENTION

This invention relates to chemical vapor reaction systems, and especially to those in which substrates receive reactant materials from the vapor state.

BACKGROUND OF THE INVENTION

Chemical vapor reaction is an increasingly useful method of processing integrated circuits. There are several classes of such reactions, which are carried out variously at atmospheric or lower pressures, at relatively higher or relatively lower temperatures, and under plasma enhanced or unenhanced condition. While the equipment of this invention has great versatility, it is primarily intended for lower pressure operation at medium to high temperatures.

Because of the high cost of materials used in integrated circuits, it is essential to maintain as high as possible the efficiency and correctness of the processing. It is economically disastrous to scrap high percentages of production runs, especially when they are carried out in batches and when the event causing the scrappage occurs at a later stage of the processing of the material, after many processes have already been completed.

One of the principal causes of scrappage is variation of uniformity in thickness and in resistivity. This in turn is often a function of improper distribution of pressure drops, or of division of flow. Often the imperfect wafers are "streaked". In pyrolytic deposition processes, temperature and time are firstorder effects. Much scrappage is also caused by irregularity in velocity of flow across the wafer because of the effect of velocity on the boundary layer conditions, and on the concentration of the reactants.

Also, in many prior art processes, it is common practice for a reactant stream to flow along a plurality of wafers, one after another. This forms a long reaction path, and the reactant concentration at a downstream wafer varies because of consumption of reactant by an upstream wafer. Furthermore, because many vapor deposition processes are carried out in batch-loading apparatus, it is important to have a large a load capacity per batch as possible. Apparatus in which the wafers are laid side-by-side inherently are spatially inefficient.

It is an object of this invention to provide a chemical vapor reaction system in which there is a short reaction path, an improved uniformity of product, and a high loading efficiency.

A chemical vapor reaction system according to this invention includes a closed reaction vessel which defines a reaction chamber. An end closure member can be opened to give access to the chamber. At least one reactant supply conduit and at least one exhaust port, are provided. These discharge into and exhaust from opposite sides of a reaction region. A boat which holds the workpieces to be treated is disposed in the reaction region. The substrates are held in a "stack" or "stacks", parallel to and spaced from one another so that reactant material flows over their surfaces. They are arranged so that each portion of the reactant stream flows over the surface of only one substrate. A distributor upstream from the substrates distributes reactant to the reaction region.

A reactant supply region and an exhaust region are formed respectively upstream and downstream from the reaction region.

According to a preferred but optional feature, a second distributor is provided downstream from the boat, between the reaction region and the exhaust region.

The above and other features of this invention will be fully understood from the following detailed description and the accompanying drawings, in which:

FIG. 1 is an axial cross-section showing the presently preferred embodiment of the invention;

FIG. 2 is a cross-section taken at line 2—2 in FIG. 1;

FIG. 4 is a top view of the boat in FIG. 3;

FIG. 5 is a side view of FIG. 4;

FIGS. 7 and 8 are fragmentary views of other exhaust conduit constructions.

Figure 3:
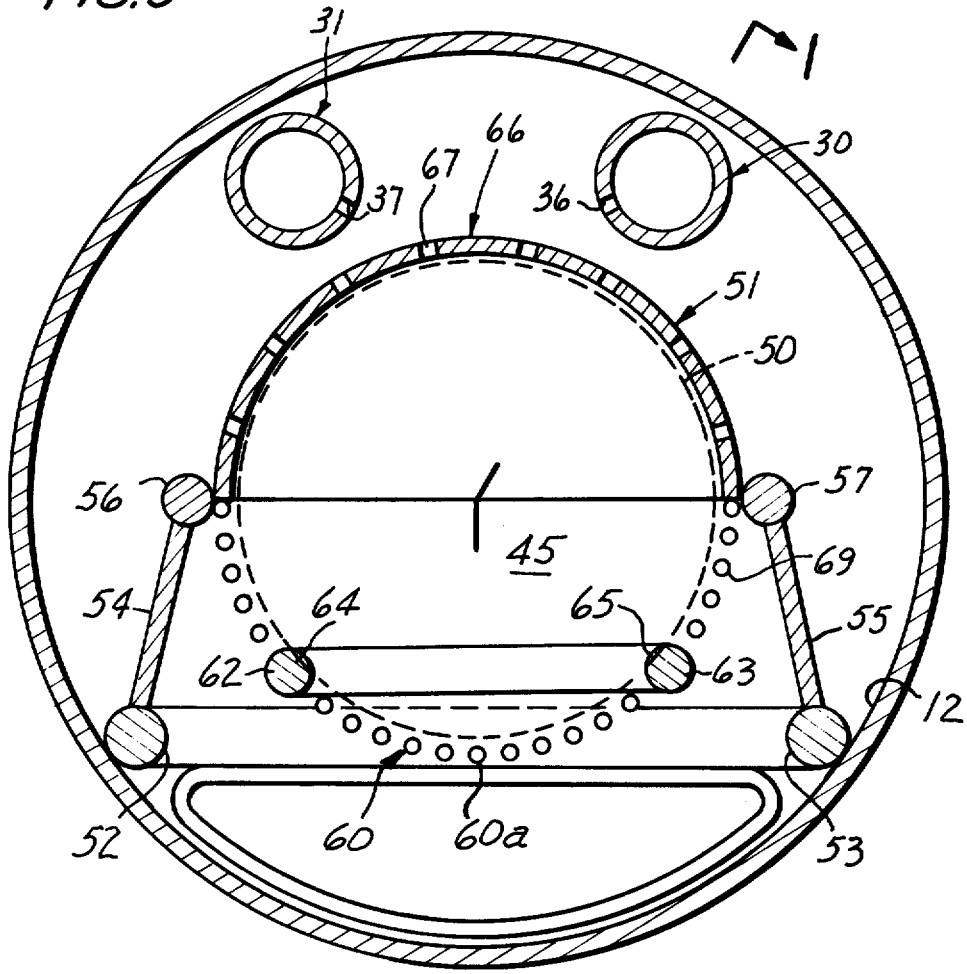
FIG. 3 is a cross-section taken at line 3—3 in FIG. 1.

The system includes a closed, fluid tight reaction vessel 10. The vessel includes a cylindrical section 11, with an inside wall conveniently formed by a length of tubing 12. This section has a longitudinal axis 13 and a cross-section of substantial area normal to it, to form a reaction chamber 14 near the middle of the vessel. The left end of the vessel in FIG. 1 is loading end 15. It includes a movable closure member 16 such as a door which bears against a transition member 17 through a vacuum seal 18. This closure gives access to the reaction chamber for cleaning, loading and unloading. The transition member is joined to the left hand end of tubing 12, also by means of conventional seals and joinders which require no description here. Means not shown is provided for releasably latching the door to the transition member. A thermocouple entry 19 is formed in the door. Vacuum fittings (not shown) will be provided in situations where sub-atmospheric pressures are to be used in the process.

A second closure 25 is provided at the right hand end of the tubing which also joins a transition member 26 by a conventional seal 27. The transition section joins to the right hand end of tubing 12, thereby completing the fluid-tight enclosure. Closure 25 may, but need not, be movable to give access to the vessel from its end.

The purpose of the reaction vessel is to define a reaction chamber (sometimes called a deposition) to receive substrates, apparatus, and reactants yet to be described. A pair of reactant supply conduits 30, 31 (sometimes called vapor supply conduits) are provided to supply reactant material to the vessel. Conduit 30 has a pair of inlets 32, 33 outside the vessel with appropriate connections to receive reactant material. Similarly, reactant supply conduit 31 has inlets 34, 35 outside the reaction vessel.

Providing two inlets for each of the conduits enables more than one reactant to be supplied to each conduit for premixing, or for the same reactant to be supplied from both ends, or for the reactant to be supplied from only one end with the other end plugged. This provides considerable versatility. Depending on the use to which the system is expected to be put, only one, or more than two, reactant supply conduits can be provided. It depends on the number of reactant materials to be used or on a need for injection of materials more generally into the reaction chamber.

Reactant supply conduit 30 has an outlet 36, and conduit 31 has an outlet 37, both located inside the reactant vessel. The conduits can if desired have more than one outlet. The presently preferred type of outlet is an axially-extending slit of substantially the same axial length as a reaction region later to be described. If desired, more than one of these outlet slits (sometimes called perforations) can be provided. Also, instead of axial slits, holes or other shapes of perforation could be provided instead. The use of a slit of closely controlled width which extends substantially uniformly for the full length of the reaction region has substantial advantages over other shapes. If two conduits are provided, the perforations preferably discharge with a component of direction toward one another. This is not a necessary feature, but in the event that reactants are to be mixed in the reaction chamber, this provides an effective way of accomplishing it. If only one conduit is used, the perforation or perforations can discharge in any direction. If more than one slit is used in each conduit, any combination can be used.

A pair of exhaust conduits 40,41 is provided near the opposite side of the reaction chamber from the reactant supply conduits. Exhaust conduit 40 passes through the wall of transition member 17. Conduit 41 passes through the wall of transition member 26. Conduit 40 has an inlet port 42, and conduit 41 has an inlet port 43 which terminate approximately at the axial ends of a reaction region 45.

Exhaust conduits 40 and 41 have flattened tops 46,47. They have bottoms which generally conform to the shape of the inside wall of the tubing and fit closely to it. Their inlet ports 42 and 43 are axially spaced apart from one another and are generally directed toward one another.

Reaction region 45 is in a central portion of tubing 12. The substrates will be processed in this region. Reaction region 45 is shorter than the reaction vessel itself. While the pressure throughout the interior of the entire reaction vessel will be at substantially the same pressure as exists in the reaction region, there will be some diffusion of reactant material toward the ends of the vessel, and some small amount of reactant material may by-pass the reaction region. However, this is of little importance economically or otherwise, and can be ignored.

The material to be treated, usually substrates comprising flat wafers 50, will be supported in a holder familiarly referred to in the trade as a "boat" 51. The boat is preferably made entirely of quartz so as not to enter into any reaction. The boat is disposed in the reaction region, and at least partly defines the reaction region.

The boat is best shown in FIGS. 3, 4 and 5. It includes a pair of base runners 52, 53 which are intended to rest against the wall of tubing 12. Because the runners and tubing are made of straight, circularly round sections, they make a good fluid restriction with one another. Any leakage past minor imperfections in their surface-to-surface-abutment will be inconsequential. Imperforate side plates 54, 55, (sometimes called "barriers") are connected to base runners, 52 and 53 and to upper runners 56, 57. In turn, the base runners, side plates, and upper runners are sealingly connected to imperforate end plates 58, 59 which are trapezoidal in shape, so as to define a "box-like" closed periphery on the boat. The plates support an optional downstream distributor 60, which is comprised of a plurality of axially extending spaced apart rods 60a fixed to the end plates to form a plurality of axial gaps, sometimes called "perforations". These perforations are in effect axial slits that extend for all or for the major portion of the length of the boat.

Other types of perforations can be provided instead, and if desired the downstream distributor can be eliminated entirely. However, it provides substantial advantages in maintaining uniformity of flow. Substrate support members 62, 63 are fixed to end plates 58 and 59. These support members include edge notches 64, 65 which are formed in an array extending substantially the full length of the boat to receive and support substrates 50 and hold them normal to axis 13. The edges of the substrates fit into these slots, so the wafers form a "stack" in which the wafers are parallel to one another, and are spaced from one another.

An upstream distributor 66 includes perforations 67. These are preferably formed as axially-extending slits in an otherwise imperforate semi-cylindrical shroud. The perforations extend for all of, or for substantially the major portion of, the length of the boat, to provide access to the inside of the boat. The upstream distributor is not optional. End plates 68, 69 are sealingly attached to the ends of the upstream distributor. The upstream distributor behaves as a lid, and can be removed and replaced to enable substrates to be loaded and unloaded. That portion of the vessel downstream from the upstream distributor and upstream from an exhaust region yet to be described, and within the length of the boat, is called "reaction region" 45. It is advantageously located at the middle portion of the tubing's length. The region downstream from the wafer support member, i.e., immediately downstream from the reaction region is sometimes called "exhaust region" 45a. The region inside the reaction chamber immediately upstream from the upstream distributor is called "reactant supply region" 45b.

The entire boat can be slid out of the reaction vessel for loading and unloading, and then can be slid back into its operation location as shown in FIG. 1, after which event the reaction vessel will be closed and pumped down if the process is to use subatmospheric pressures. Heaters may already be on, or may be turned on, if the process requires heat. Reactant material will be introduced into the reactant supply region through one or more of the reaction supply conduits and excess and depleted material will be drawn from the exhaust region through the exhaust conduits. Flow of reaction material will be through the perforations in the reaction supply conduit or conduits, through the perforations in the upstream distributor, across the surface of the wafers, through the perforations in the downstream distributor (when one is used), into the exhaust region, and then to one or both exhaust conduits.

Figure 6:
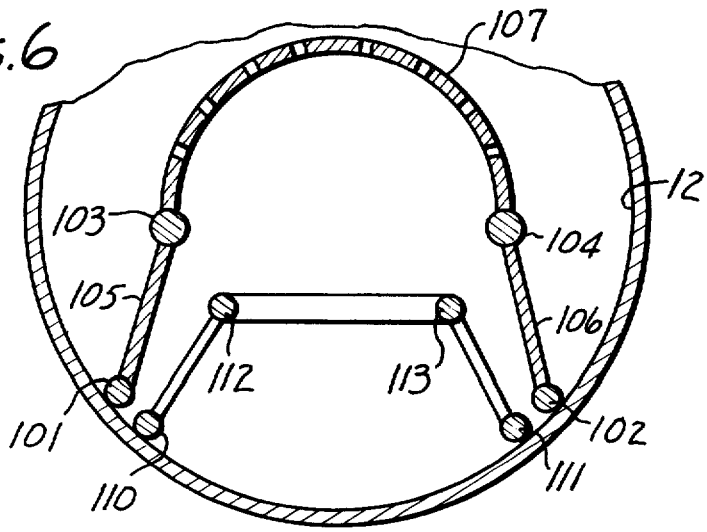
FIG. 6 is a cross-section of another embodiment of boat construction.

FIG. 6 shows a boat and upstream distributor arrangement which can be used when a downstream distributor is not used. Two lower runners 101,102 and two upper runners 103,104 are joined by a pair of side plates 105,106 as in FIG. 3. An upstream distributor 107 identical to distributor 66 in FIG. 3 is mounted to the upper runners. This structure overhangs the support portion of the boat. The boat includes a pair of supports 110, 111 to which rods 112, 113 are attached by rods or the like. Rods 112 and 113 are notched, the same as rods 62 and 63, to support substrates. Appropriate generally trapezoidal end plates (not shown) are attached to the distributor and side plates as in FIG. 3 for the same purpose. Supports 110, 111 fit within the barrier formed by the side plates.

FIGS. 7 and 8 show other constructions for forming an exhaust region downstream from the reaction region. In FIG. 7, a single exhaust conduit 120 is provided. A notch 121 is formed in its wall which has about the same length and width as the reaction region. The notch is placed immediately downstream from the reaction region, and the boat fits closely to the conduit around the notch. The volume 121a just inside the notch is the "exhaust region", and exhaust flow passes through ends 122 and 123 of the conduit.

FIG. 8 shows a single-ended exhaust conduit 125. It is blocked at end 126, and has a notch 127 in its wall identical to notch 121, for the same purpose. The volume 127a just inside the notch is the "exhaust region", and exhaust flow passes through end 128 of the conduit.

It is preferable but not necessary for the ends of the exhaust conduits to make a close and flow restricting contact with the boat in order to close the exhaust region at the ends of the boat. A true sealing contact is not necessary, because the division of flow in a system such as this will be such that leakage around the end of the boat will be unimportant to the process. Even though the boat, and therefore the upstream distributor, do not necessarily make a fluid seal, but instead may make only a flow restricting contact, the upstream distributor functionally separates the reaction supply region from the reaction region.

There are many useful variations on the system as described, which will still provide the benefits of this invention. An objective of the invention is to maintain uniform flow across the reaction region, that is, the same flow in the path across all the substrates in the reaction zone. This results in maximum uniformity of deposition on the substrates. This objective is accomplished in part by providing a sensibly large reactant supply region and exhaust region. These behave rather like plenums. In the reactant supply region, the reactant material is provided at a pressure reduced by upstream valves and is axially distributed by the perforations in the reactant supply conduits. It flows around the upstream distributor, and is made radially uniform by the various perforations as it passes through the upstream distributor.

The exhaust conduit and downstream distributor help keep the uniform flow pattern through the wafers by creating a region into which the excess and depleted reactant flows without deleterious acceleration or change of direction. This material can then be drawn from an end or ends of the exhaust region without disturbing the flow through the reaction region.

The upstream distributor divides and distributes the flow into the reaction region so as to most uniformly treat the substrate. A downstream distributor will often improve the distribution of reactant within the reaction region.

From the foregoing, it will be appreciated that the terms "upstream" and "downstream" have been deliberately used, instead of "upper" and "lower", for example. The system will function with flow from top to bottom, from bottom to top, from side to side, and and even from top or bottom to side, relative to the horizontal, so long as the flow through the reaction region itself occurs with maximum flow uniformity and minimum change in direction. For example, a sharp change in path direction across the substrate is to be avoided.

As to the exhaust circuit, a conduit inside the reaction chamber is not necessary. Instead, an exhaust port through the wall or end of the chamber could open directly into the exhaust region. However, practical constructions will ordinarily include an exhaust conduit which reaches out to the reaction region.

The substrates, usually wafers, are most advantageously arrayed in a stack of parallel wafers, the stack (or stacks) extending axially in the vessel, with the wafers normal to the axis. However, they can also be stacked slanted (but still parallel to each other), and in stacks which extend crosswise, with the wafers parallel to the axis. When plural stacks are used, they can extend either parallel or crosswise. What is to be avoided is one substrate, downstream from another substrate, such that the downstream substrate would receive partially depleted reactant material. This invention provides an optimally short path length relative to the substrates.

FIG. 3 shows two types of distributors. The upper one is a slotted shroud. The lower one is a group of spaced-apart rods In both cases perforations are formed, by slots, or by spacings. Holes in a shroud could be used instead. Any of these can be used for both upstream and downstream distributors, or for either.

By way of example, a shroud 66 may have eight slits 67, each about 0.025 inches in width in a shroud having a radius of curvature of about 2.5 inches. The actual dimensions and number of slots or holes will frequently be determined by the process to be performed. The example is suitable for silicon dioxide deposition using silane and oxygen on 4.0 inch diameter substrates.

The term "chemical vapor reaction" means not only the deposition of a reactant on a surface to form a new compound which remains on the surface, but also the creation of a compound which removes material from the surface. The former forms a deposited film on the surface, and the latter etches the surface. Either of these types of reaction may or may not be plasma-enhanced. The term "vapor" includes a plasma, a plasma, of course, being vapor molecules in a more excited state.

This invention is not to be limited by the embodiments shown in the drawings and described in the description which are given by way of example and not of limitation, but only in accordance with the scope of the appended claims.

I claim:

1. A vacuum vapor deposition apparatus comprising:
   a horizontally disposed vessel having an inside wall, a longitudinal extent thereof defining a deposition chamber, said vessel having a movable closure at one end thereof for loading and unloading;
   at least one upstream vapor supply conduit extending along a first elevation in the vessel and being perforated coextensively with the deposition chamber;
   means disposed at a second elevation in the vessel and coextensively aligned with the perforated portion of the supply conduit and supporting spaced substrates arranged in a stack along a longitudinal extent of said deposition chamber;
   said means including a continuous skirt portion conforming generally at a first one of its ends to the periphery of said stack at a location spaced from said inside wall and at its other end conforming to said inside wall;
   an arcuate vapor distributor conforming generally to the upstream portion of said stack, perforated coextensively with its longitudinal extent, and continuously operatively associated with said first end of the skirt; and
   exhaust means including an exhaust region immediately downstream from said stack encompassing the entire lateral-to-flow cross section of the downstream side of the skirt, and an exhaust conduit conveying vapor from said exhaust region to the outside of the vessel;

whereby vapor supplied through said perforated conduit and passing through said distributor is constrained to pass between the spaced substrates to effect said deposition and to exit through said exhaust region and exhaust conduit.

2. A system according to claim 1 in which said perforation in said supply conduit comprises a plurality of holes.

3. A system according to claim 1 in which said perforation in the supply conduit is an axially extending slit.

4. A system according to claim 1 in which there is a pair of said supply conduits, said conduits being parallel to and spaced apart from one another.

5. A system according to claim 4 in which the perforation in each supply conduit is an axially-extending slit.

6. A system according to claim 5 in which said slits discharge reactant material in directions having a component of direction toward one another.

7. A system according to claim 1 in which the perforations in the distributor comprises axially extending slits.

8. A system according to claim 1 in which the first recited means includes a downstream distributor disposed on the downstream side of said stack from said upstream distributor, said downstream distributor having perforations therethrough.

9. A system according to claim 8 in which said distributors abut one another to enclose said substrates, one said distributor being removable to give access to said substrate mounting means.

10. A system according to claim 9 in which the perforations through both distributors comprise a plurality of axially-extending slits.

11. A system according to claim 1 in which said exhaust means comprises at least one exhaust conduit disposed inside of said vessel and communicating with said port.

12. A system according to claim 11 in which a said exhaust means comprises a second exhaust conduit communicating with said port and opposed to the first exhaust conduit.

13. A system according to claim 1 in which said substrate support means supports said substrates in a stack whose members are parallel to and spaced apart from one another, and normal to the axis of the stack.

* * * * *